(12) United States Patent
Perkins

(10) Patent No.: US 9,384,932 B2
(45) Date of Patent: Jul. 5, 2016

(54) THICK-FILM RESISTORIZED CERAMIC INSULATORS FOR SEALED HIGH VOLTAGE TUBE ELECTRODES

(75) Inventor: Luke Perkins, Plainsboro, NJ (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 387 days.

(21) Appl. No.: 13/881,347

(22) PCT Filed: Oct. 27, 2011

(86) PCT No.: PCT/US2011/058064
§ 371 (c)(1),
(2), (4) Date: Jul. 19, 2013

(87) PCT Pub. No.: WO2012/058414
PCT Pub. Date: May 3, 2012

(65) Prior Publication Data
US 2013/0293091 A1    Nov. 7, 2013

Related U.S. Application Data

(60) Provisional application No. 61/407,219, filed on Oct. 27, 2010.

(51) Int. Cl.
*H01J 29/02* (2006.01)
*H01J 3/02* (2006.01)
*H01J 29/48* (2006.01)
*H01J 29/96* (2006.01)
(Continued)

(52) U.S. Cl.
CPC .............. *H01J 29/02* (2013.01); *H01J 3/027* (2013.01); *H01J 29/485* (2013.01); *H01J 29/96* (2013.01); *H01J 31/50* (2013.01); *H01J 37/248* (2013.01); *H05H 3/06* (2013.01); *H01C 3/14* (2013.01); *H01C 17/06553* (2013.01); *H01J 2235/02* (2013.01)

(58) Field of Classification Search
CPC ..... H01J 2235/02; H01J 29/96; H01J 37/248; H01J 27/00; H01J 37/00; H05H 3/06
See application file for complete search history.

(56) References Cited

U.S. PATENT DOCUMENTS 3,775,216 A    11/1973    Frentrop
4,499,592 A    2/1985    Brettschneider et al.
(Continued)

FOREIGN PATENT DOCUMENTS

EP    536895 A1    4/1993
JP    02163901 A    6/1990
(Continued)

OTHER PUBLICATIONS

International Search Report for PCT Application Serial No. PCT/US2011/058064 dated May 31, 2012.

*Primary Examiner* — Nimeshkumar Patel
*Assistant Examiner* — Jacob R Stern
(74) *Attorney, Agent, or Firm* — Michael Dae

(57) ABSTRACT

An annular ceramic washer has inner and outer cylindrical surfaces, first and second annular surfaces, and a winding path thick film resistor located on the inner surface. Metal washers are preferably brazed to the end ring surfaces. The annular ceramic washer is useful in vacuum tube applications in establishing a voltage on a target utilizing the voltage of an electrode coupled to the winding path thick film resistor.

21 Claims, 6 Drawing Sheets

(51) Int. Cl.
  *H01J 31/50* (2006.01)
  *H01J 37/248* (2006.01)
  *H05H 3/06* (2006.01)
  *H01C 3/14* (2006.01)
  *H01C 17/065* (2006.01)

(56) References Cited

U.S. PATENT DOCUMENTS

| | | | |
|---|---|---|---|
| 4,599,542 A | 7/1986 | King et al. | |
| 4,618,977 A | 10/1986 | Brettschneider et al. | |
| 4,866,411 A * | 9/1989 | Caddock | 338/62 |
| 5,293,410 A | 3/1994 | Chen et al. | |
| 5,426,345 A | 6/1995 | Madsen | |
| 2005/0232395 A1 | 10/2005 | Smith et al. | |
| 2008/0122461 A1* | 5/2008 | Ernest et al. | 324/713 |
| 2009/0174523 A1 | 7/2009 | Harada et al. | |
| 2009/0237200 A1* | 9/2009 | Yoneda | 338/307 |
| 2011/0100684 A1* | 5/2011 | Hornig et al. | 174/256 |

FOREIGN PATENT DOCUMENTS

| | | |
|---|---|---|
| JP | 2000021601 A | 1/2000 |
| JP | 2005041712 A | 2/2005 |
| WO | 2013103328 A1 | 7/2013 |

* cited by examiner

THICK-FILM RESISTORIZED CERAMIC INSULATORS FOR SEALED HIGH VOLTAGE TUBE ELECTRODES

BACKGROUND OF THE INVENTION

1. Field of the Invention

This invention relates broadly to sealed high voltage tube applications such as neutron generator tubes, X-ray tubes and photomultiplier tubes where high voltage electrodes are present, charged particles flow, and high voltage electrodes must be maintained at well-defined voltage levels relative to each other. This invention has particular application to sealed high voltage tubes useful in the petrophysical arts where the high voltage tubes are constricted to small spaces and are subjected to extreme environments and rough handling, although the invention is not limited thereto.

2. State of the Art

Numerous sealed high voltage tube applications where high voltage electrodes are present and charged particles flow as a current require that the electrodes be at well-defined voltages. Such applications include, but are not limited to, neutron tubes, X-ray tubes and photomultiplier tubes.

There are two common approaches to assign a voltage to an electrode. The most straight-forward approach is to connect the electrode to a power supply. This approach is most often utilized when there are no space constraints affecting how the voltages are generated and applied to the electrodes. A second approach is to define an electrode voltage relative to another electrode by means of a resistance connecting the two electrodes, whereby the electrical current flowing between the two electrodes together with the resistance will define a voltage drop according to Ohm's law. This second approach is typically used in space constrained applications.

Where a resistor is used to define an electrode voltage in sealed high voltage tube applications, the resistor is typically physically connected between the electrodes via welding of the resistor leads to the electrodes. In environments where the sealed tube is part of a system which is subject to shock, vibration, large temperature changes, and other extreme conditions, the welds are prone to failure.

SUMMARY OF THE INVENTION

In accord with one embodiment of the invention, a ceramic washer that insulates one electrode from another is provided with a winding path thick-film resistor which is electrically coupled to each electrode and which defines a voltage drop.

According to one aspect of the invention, the ceramic washer is an annular ceramic element which provides mechanical support to one or both of the electrodes to which it is electrically coupled.

According to one embodiment, the thick-film resistor is applied in a serpentine fashion to an inside surface of an annular ceramic element. According to another embodiment, the thick-film resistor is applied in a helical fashion to the inside surface of the annular ceramic element.

According to a further embodiment of the invention, each end of annular ceramic element is coupled to a metal washer which contacts a respective electrode. The hermetic metal to ceramic coupling may be accomplished by brazing with a material such as KOVAR (a trademark of Carpenter Technology Corporation) or by other techniques known in the art.

According to one embodiment of the invention, contact between the thick-film resistor and the metal washers which are attached to the ends of the ceramic element is obtained by metallizing the ceramic element at each end of the thick-film resistor and using the metallization as contact pads for electrical interconnect with the metal washers. According to another embodiment of the invention, contact between the thick-film resistor and the metal washers is accomplished by providing metal tabs on the washers. With contact made between the thick film resistor and the metal washers, when one of the electrodes is provided with a voltage potential, the thick-film resistor provides a voltage drop that is used to supply the requisite voltage potential to the other electrode.

Objects and advantages of the invention will become apparent to those skilled in the art upon reference to the detailed description taken in conjunction with the provided figures.

DETAILED DESCRIPTION OF THE PREFERRED EMBODIMENTS

Figure 1:
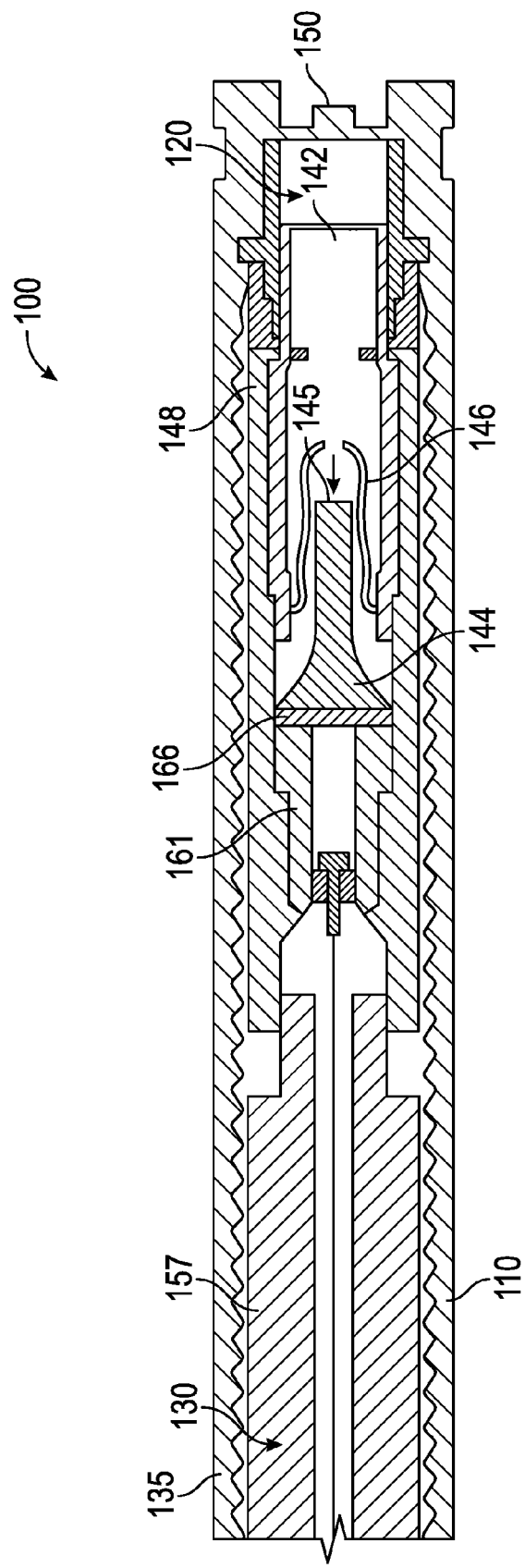
FIG. 1 is a schematic diagram of a prior art neutron generator.

Embodiments of the invention will be described with reference to a pulsed neutron generator (PNG), although the invention is not limited thereto and can find use with respect to any vacuum tube application where electrodes of different voltages are utilized. Before describing embodiments of the invention, a general understanding of a prior art PNG is useful. As seen in prior art FIGS. 1 and 1a, PNG 100 includes an external housing 110 in which a compact high voltage linear particle accelerator (Minitron) 120 and a high voltage power supply 130 are located. One or more insulating sleeves 135 are provided between the external housing 110 and the Minitron 120 and high voltage power supply 130. The Minitron 120, among other things, includes a cathode 142, a copper target 144 having a metal hydride target face 145 that typically contains deuterium and/or tritium, and a suppressor electrode 146 with an on-axis beam spot opening surrounding the target face, all of which is at least partially contained within an evacuated sealed ceramic tube 148. A Minitron bulkhead 150 is located on the end opposite the target 144. The high voltage power supply 130 includes a high voltage power supply (HVPS) bulkhead (not shown), a ladder of components (not shown) located and electrically connected between the HVPS bulkhead and a corona shield 161, and a support or "backbone" element 157 which physically holds and supports the components 154. The HVPS 130 generates a very high voltage (i.e., at least 50,000V and more typically 80,000V-100,000V) which is applied to a corona shield 161 which surrounds the target 144. The corona shield 161 is in contact with the suppressor electrode 146. A resistor 165 (see FIG. 1*a*) is electrically coupled between the corona shield 161 and the target 144, thereby establishing the (high) voltage of the target. With a high voltage target, deuterium and/or tritium isotopes in the Minitron are ionized and accelerated into the target face to cause a fusion reaction that generates neutrons as a byproduct.

Figure 1A:
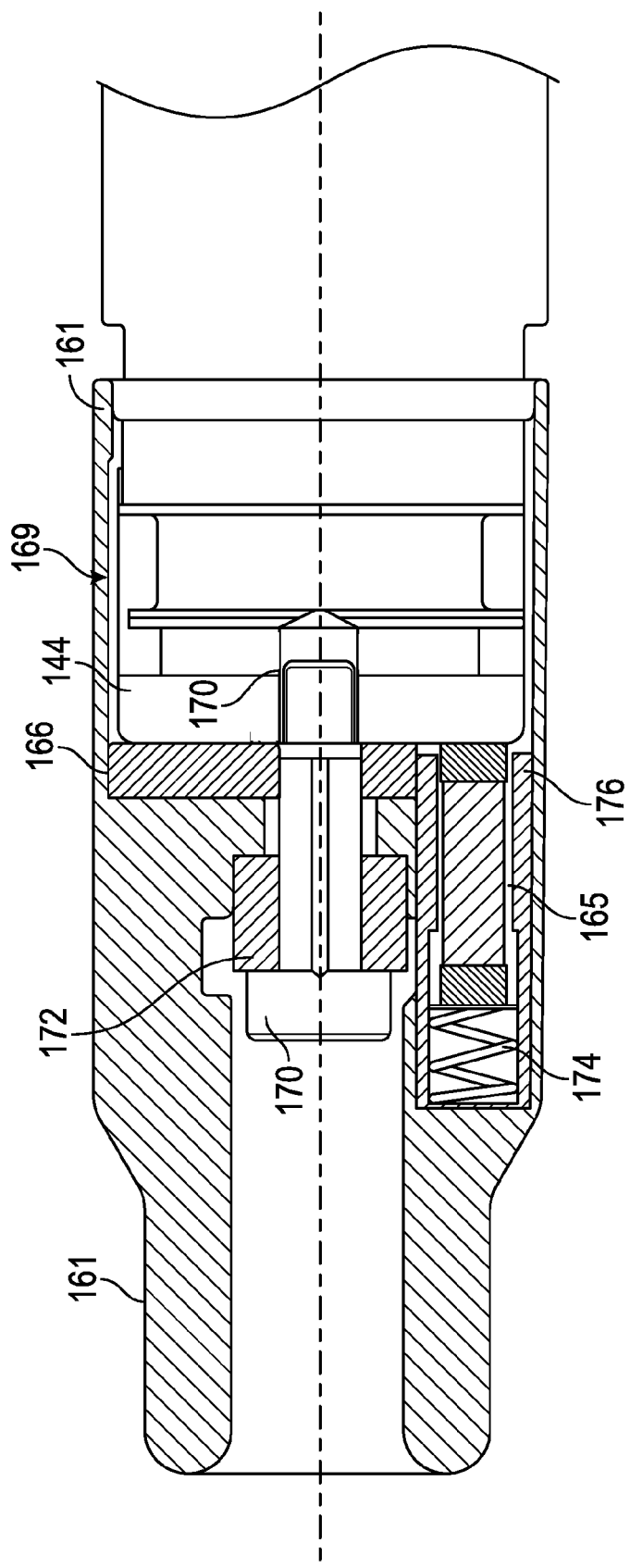
FIG. 1a is a cross-sectional view of a portion of prior art FIG. 1.

As seen in FIG. 1*a*, the target 144 and corona shield 161 are separated axially by a ceramic washer 166 which electrically insulates one from the other, and circumferentially by an optional insulator 169 which may take the form of an electrically insulating tape. Ceramic washer is adapted to receive a screw 170 which engages and mechanically supports the target 144. The screw 170 is electrically insulated from the corona shield 161 by the washer 166 and by another insulating washer 172.

Because the target 144 reaches high temperatures, and because the PNG is often used in environments which are subject to shock and vibration, physical coupling of the resistor 165 to the target 144 and the corona shield 161 can pose reliability problems as parts move, expand and contract during use. Thus, as seen in prior art FIG. 1*a*, a metallic spring 174 in contact with the corona shield 161 can be used to push the resistor 165 into contact with the target 144. An electrically insulating sleeve 176 extends around the spring 174 and the resistor 165 so that the spring and resistor are insulated from the corona shield except where one end 174*a* of the spring 174 contacts the corona shield 161.

Figure 2:
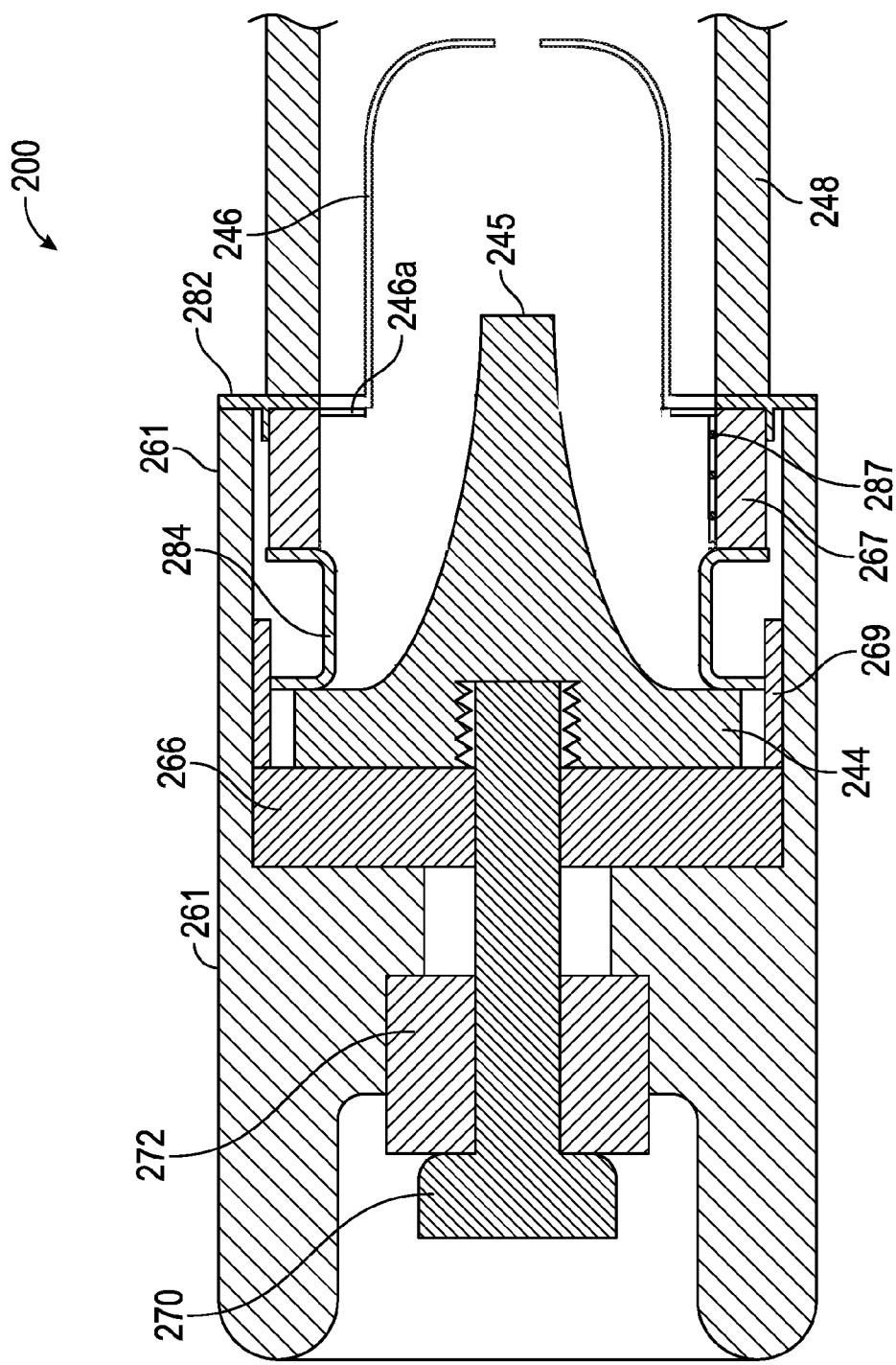
FIG. 2 is a cross-sectional view of a portion of a neutron generator utilizing a resistorized annular ceramic washer according to one embodiment of the invention.

Turning now to FIG. 2, a cross-sectional view is provided of a portion of a neutron generator 200 utilizing a resistorized annular ceramic washer 267 according to one embodiment of the invention. FIG. 2 shows the same portion of the neutron generator seen in FIG. 1*a*, and similar elements are identified with similar numbers increased by "100". As seen in FIG. 2, PNG 200 has a target 244 with front face 245. A suppressor electrode 246 is provided with an on-axis beam spot opening surrounding the target. The suppressor electrode sits within the evacuated ceramic tube 248 and is connected to the corona shield 261 at flange 246*a*. The resistorized ceramic washer 267 is coupled between the suppressor electrode flange 246*a* and the rear portion of the target 244 (i.e., rearward of the target face 245). The sole purpose of the resistorized ceramic washer 267 is to provide a desirably resistive electrical path 287 between the suppressor electrode 246 and the target 244, thereby establishing the (high) voltage of the target. The resistorized ceramic washer 267 does not directly affect the ion beam. However, provision of the resistorized ceramic washer 267 eliminates the need for the separate resistor, spring, and insulating sleeve surrounding the resistor and spring as provided in the prior art (FIG. 1*a*). In addition, by providing the resistorized ceramic washer 267 inside the sealed evacuated tube portion of the PNG, the thick film resistance of the washer can be well-defined and not affected during manufacture, is protected during assembly and use, and is rugged in that it has no moving parts.

Coupled to the resistorized ceramic washer 267 are metal washers 282, 284 (seen best in FIGS. 3*a* and 3*b* and discussed below). Metal washer 282 is preferably brazed to the ceramic washer 267 (prior to the ceramic washer 267 being resistorized) and is in contact with the corona shield 261. Likewise, metal washer 284 is preferably brazed to the ceramic washer 267 (prior to the ceramic washer 267 being resistorized) and is in (metal-to-metal) contact (e.g., welded) with the target 244. It is noted that the target 244 is held in place by screw 270 which is electrically insulated from the corona shield 261 by an insulating washer 272. Likewise, an insulating washer 266 is located between the corona shield 261 and the back face of the target 244. The corona shield is shown to extend around the target 244 and is circumferentially insulated from the target by an optional insulator (tape) 269. It is also noted that the suppressor electrode 246 is shown to extend rearward of flange 246*a*, thereby supplying a sputter shield to the resistorized ceramic washer 267.

Figure 3A:
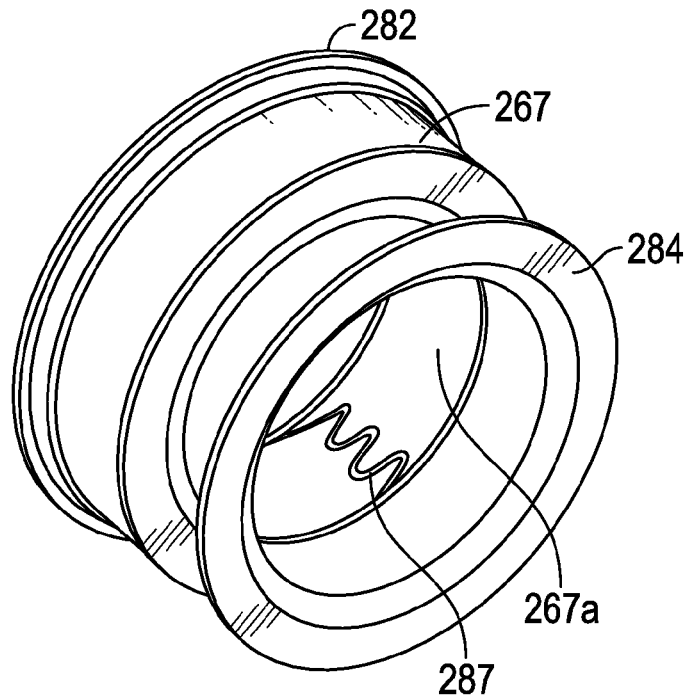
FIG. 3a is a perspective view of a first embodiment of the resistorized annular ceramic washer of FIG. 2 with metal washers welded thereto.
Figure 3B:
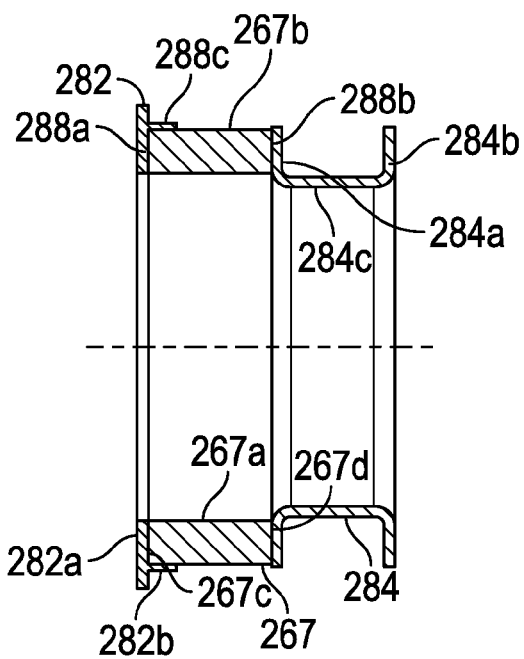
FIG. 3b is a cross-sectional view of the first embodiment of the resistorized annular ceramic washer of FIG. 2 with metal washers welded thereto.

Details of the resistorized ceramic washer 267 of FIG. 2 with the metal washers 282, 284 welded thereto are seen in FIGS. 3*a* and 3*b*. More particularly, resistorized ceramic washer 267 is an annular washer having inner and outer cylindrical surfaces 267*a*, 267*b* and first and second end annular surfaces 267*c*, 267*d*, and a winding serpentine path thick film resistor 287 is located on the inner surface 267*a*. The material of the thick film resistor 287 is preferably selected from a ceramic-metal (cermet) material such as ruthenium dioxide ($RuO_2$)—lead borosilicate glass system, or barium tantalite ($BaTa_2O_6$)—borosilicate glass system, although other materials (cermet or otherwise) can be utilized. According to one embodiment of the invention, the resistive film is laid down as a flowable paste and cured in place, e.g., by sintering. Curing the resistive thick film causes the resistor to be integrally formed on the ceramic. Optionally, after curing, the thick film can be encapsulated or coated with a protective non-conductive material such as glass frit or spray-on ceramic.

According to one aspect of the invention, the thick film path preferably has a high resistance (for purposes herein "high resistance" being at least 1 MOhm), although depending upon the operating duty cycle, the geometry and other operating and physical details of the PNG, other resistances might be in order. When used to define a voltage difference between electrodes of a particular PNG, the thick film path 287 could have a resistance of between 5 MOhm and 15 MOhm. Depending upon the desired resistance, the thickness (height) and width of the thick film (ink), and length of the serpentine thick film path is selected. A typical thick film path thickness is approximately 0.0005 inches, although it may vary by several orders of magnitude. A typical thick film path width is approximately 0.002 inches, although it may vary by several orders of magnitude. The path length is preferably several inches, although again, it may vary by one or more orders of magnitude depending upon the width, length, and desired resistance.

According to another aspect of the invention, the thick film path is recessed in a groove (not shown) in the resistorized ceramic washer 267 as taught in co-owned copending patent application Ser. No. 61/388,156 filed provisionally on Sep. 30, 2010.

Figure 3C:
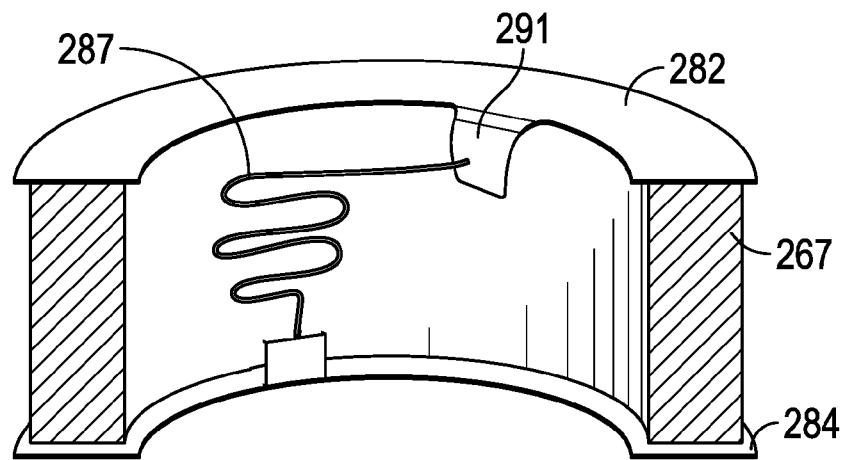
FIG. 3c is a perspective view of the resistorized annular ceramic washer of FIG. 2 showing a metal washer welded thereto with the washer having a metal tab.

According to an additional aspect of the invention, and as seen best in FIG. 3*b*, the resistorized ceramic washer 267 may be metallized on each end 267*c*, 267*d* to provide pad surfaces 288*a*, 288*b* for contact with metal washers 282, 284. Where pad surfaces 288*a* and 288*b* are provided, the thick film path 287 electrically connects one pad to the other. In addition, the resistorized ceramic washer may be also metallized on a portion of its outer surface 267*b* to provide a pad surface 288*c* for contact with metal washer 282. In lieu of metallizing the resistorized ceramic washer, one or both of the metal washers 282, 284 may be provided with metal tabs 291 (as seen in FIG. 3*c*) for making contact with the thick film path.

According to a further aspect of the invention, the metal washers 282, 284 are brazed to the ceramic washer 267 (before it is resistorized). Brazing may be accomplished through the use of a material such as KOVAR or by other techniques known in the art.

As seen best in FIG. 3b, metal washer 282 has an annular front flange 282a defining an inner diameter approximately equal to the inner diameter of the resistorized ceramic washer 267 and an outer diameter that is larger than the outer diameter of the resistorized ceramic washer 267. The outer surface of the annular front flange is intended to be in contact with the corona shield 261 of the PNG. Extending perpendicularly from the annular front flange is a circumferential axial flange 282b which is intended to engage the outer cylindrical surface 267b of the ceramic washer 267. The engagement between axial flange 282b and the outer cylindrical surface 267b of the ceramic washer 267 provides alignment for brazing, or coupling by other means known in the art. Other geometric arrangements of contacting the corona shield are possible and known to those skilled in the art.

Also, as seen best in FIG. 3b, metal washer 284 is grommet-shaped with end flanges 284a, 284b and an axial wall 284c connecting them. Flange 284a is intended to contact the second end ring (annular) surface 267d of the resistorized ceramic washer 267R and has an outer diameter substantially equal to the outer diameter of the ceramic washer 267. Flange 284b is intended to contact the target 244.

According to one embodiment, the ceramic washer 267 has an inner diameter of approximately 0.70 inches, an outer diameter of approximately 0.88 inches, and a height of approximately 0.25 inches, although it will be appreciated that other sizes are possible and encompassed by the invention.

Figure 4:
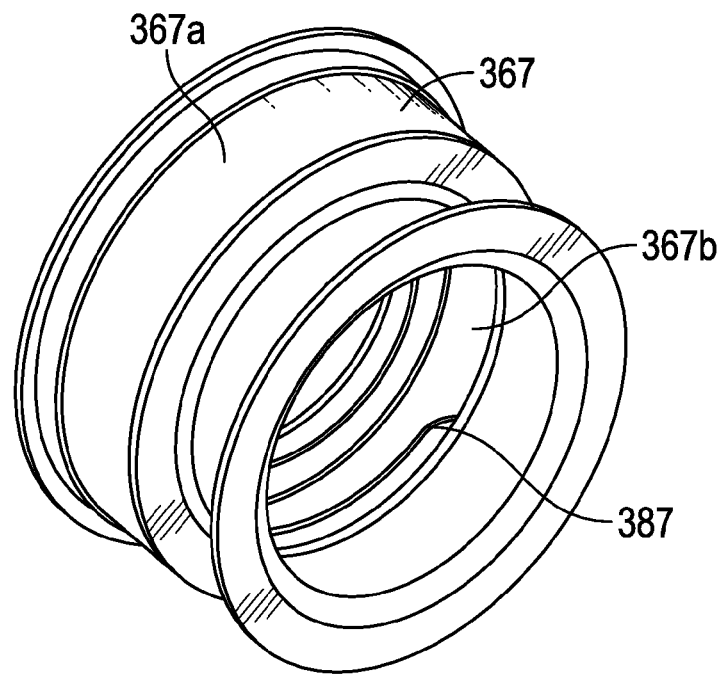
FIG. 4 is a perspective view of a second embodiment of the resistorized annular ceramic washer of FIG. 2 with metal washers welded thereto.

A second embodiment of a resistorized annular ceramic washer with metal washers brazed thereto is seen in FIG. 4. Resistorized annular ceramic washer 367 is similar to the resistorized ceramic washer 267 of FIGS. 3a and 3b (with like parts denoted by numbers increased by "100") except that instead of the thick-film path assuming a serpentine arrangement, the thick-film path 387 of washer 367 on the inner cylindrical surface 367a assumes a winding helical arrangement. In both cases, the width of the path is small compared to the length of the path. With the winding helical path arrangement, a given path length and hence the desired resistance can be obtained with a shorter washer; i.e., the height of the cylinder defined cylindrical surfaces 367a, 367b is smaller than the height of the cylinder defined by cylindrical surfaces 267a, 267b.

Figure 5:
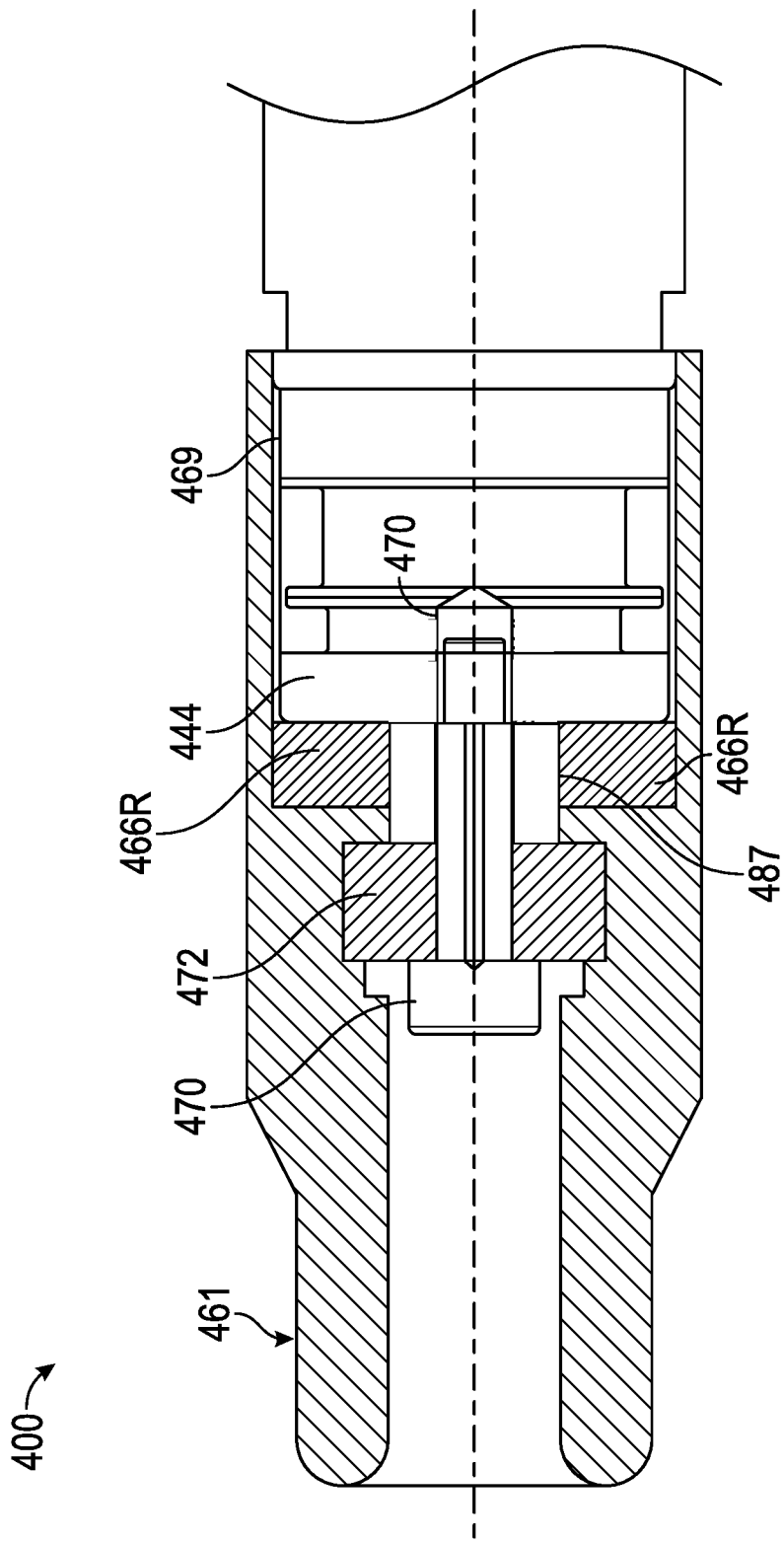
FIG. 5 is a cross-sectional view of a portion of a neutron generator utilizing a resistorized annular ceramic washer according to a second embodiment of the invention.

Turning now to FIG. 5, a portion of another embodiment of a PNG 400 which utilizes a resistorized ceramic washer 466R is shown, with elements similar to the PNG of FIG. 1a increased by "300". PNG 400 has a target 444 and corona shield 461 separated circumferentially by optional resistive tape 469 and separated axially by a resistorized ceramic washer 466R. The corona shield 461 is shown to extend from one side of the resistorized ceramic washer 466R and around the ceramic washer 466R and around the target 444. Resistorized ceramic washer 466R electrically insulates the target 444 from the corona shield 461, except that resistorized washer 466R provides a high resistance electrical path 487 (such as path 287 of FIG. 3a or path 387 of FIG. 4) on its inner surface which runs between the corona shield 461 and the target 444, thereby establishing the (high) voltage of the target. The end/disc faces of the resistorized ceramic washer 466R are preferably metallised and connected to the thick film resistor 487. Provision of the resistorized ceramic washer 466R eliminates the need for the separate resistor, spring, and insulating sleeve surrounding the resistor and spring as provided in the prior art (FIG. 1a). Optionally coupled to the resistorized ceramic washer 466R are metal washers (not shown) which are brazed to the resistorized ceramic washer 466R, in contact with the high resistance electrical path of the washer, and in respective contact with the corona shield 461 and the target 444.

As seen in FIG. 5, the resistorized washer 466R is adapted with a hole to receive the screw 470 which engages and supports the target 444. The screw 470 is electrically insulated from the corona shield 461 by insulating washer 472. In addition, the inside hole of the ceramic washer 466R on which the thick film resistor path is provided is sufficiently large so that the screw 470 passes through the washer with significant clearance between the screw and the resistorized thick film path 487. Because the resistorized ceramic washer 466R of PNG 400 is not located inside the sealed evacuated tube portion of the PNC, it can be readily replaced if it fails. However, it may be subject to different atmospheres and processes during manufacture and operation of the PNG. Therefore, according to one embodiment of the invention, the high resistance electrical path 487 is optionally coated with glass or another non-conductive, generally inert coating.

There have been described and illustrated herein several embodiments of a resistorized ceramic washer that insulates one electrode from another but which is provided with a winding path thick-film resistor which is electrically coupled to each electrode and which defines a voltage drop. While particular geometries of the thick-film path have been described, it will be appreciated that other geometries could be utilized. Similarly, while particular geometries of the metal washers which are electrically and mechanically coupled to the resistorized ceramic washer have been described, it will be appreciated that other geometries could be utilized. Further, while the invention has been described with reference to a pulsed neutron generator, it will be appreciated that it has application to vacuum tubes where high voltage electrodes must be maintained at well-defined voltage levels relative to each other. It will therefore be appreciated by those skilled in the art that yet other modifications could be made to the provided invention without deviating from its spirit and scope as claimed.

What is claimed is:
1. An apparatus, comprising:
   a high voltage electrode;
   a target for emitting neutron or X-ray, and
   an annular ceramic washer having inner and outer cylindrical surfaces, first and second end annular surfaces, and a winding path thick film high resistance resistor integrally formed on said annular ceramic washer;
   wherein said winding path thick film resistor electrically couples at least one of the high voltage electrode and the target for emitting neutron or X-ray.
2. An apparatus according to claim 1, wherein:
   a first metal washer is brazed to said first end annular surface and a second metal washer is brazed to said second end annular surface.
3. An apparatus according to claim 1, wherein:
   said winding path thick film resistor has a serpentine path.
4. An apparatus according to claim 1, wherein:
   said winding path thick film resistor has a helical path.
5. An apparatus according to claim 1, wherein:
   said annular ceramic washer is metallized on at least one of said first end and second end annular surfaces.
6. An apparatus according to claim 1, wherein:
   said winding path thick film high resistance resistor has a resistance of between 5 MOhm and 15 MOhm.

7. An apparatus according to claim 1, wherein:
said winding path thick film high resistance resistor comprises a ceramic-metal material.

8. An assembly comprising:
a high voltage electrode;
an ion beam target; and
an annular ceramic washer assembly including an annular ceramic washer having inner and outer cylindrical surfaces, first end and second end annular surfaces, and a winding path thick film resistor integrally formed on said annular ceramic washer, said winding path thick film resistor electrically coupling said high voltage electrode and said ion beam target.

9. An assembly according to claim 8, wherein:
said thick film resistor has a resistance chosen to establish a voltage on said ion beam target.

10. An assembly according to claim 8, wherein:
said assembly includes an evacuated tube structure and said annular ceramic washer assembly is located in said evacuated tube structure.

11. An assembly according to claim 10, wherein:
said annular ceramic washer assembly is welded to said evacuated tube structure.

12. An assembly according to claim 10, wherein:
said high voltage electrode comprises a suppression electrode.

13. An assembly according to claim 10, wherein:
said suppression electrode extends between said target and said annular ceramic washer.

14. An assembly according to claim 8, further comprising:
a screw, wherein
said annular ceramic washer has an annulus, and said target has a face and a back portion distal from said face, and said screw extends through said annulus of said annular ceramic washer without touching said annular ceramic washer and into said back portion of said target.

15. An assembly according to claim 14, wherein:
said high voltage electrode extends from beyond from said second end annular surface, around said outer cylindrical surface, and beyond said first end annular surface and around said target.

16. An assembly according to claim 8, wherein:
said winding path thick film resistor is integrally formed on said inner cylindrical surface, and
said ceramic washer assembly further comprises a first metal washer mechanically coupled to said first end annular surface and electrically coupled to said winding path thick film resistor and a second metal washer mechanically coupled to said second end annular surface and electrically coupled to said winding path thick film resistor.

17. An assembly according to claim 16, wherein:
said first metal washer is brazed to said first end annular surface and said second metal washer is brazed to said second end annular surface.

18. An assembly according to claim 8, wherein:
said winding path thick film resistor has a serpentine path.

19. An assembly according to claim 9, wherein:
said winding path thick film resistor has a helical path.

20. An assembly according to claim 8, wherein:
said winding path thick film resistor has a resistance of between 5 MOhm and 15 MOhm.

21. An apparatus according to claim 8, wherein:
said winding path thick film resistor comprises a ceramic-metal material.

* * * * *